United States Patent [19]

Krol

[11] Patent Number: 5,367,666
[45] Date of Patent: Nov. 22, 1994

[54] INCONSISTENCY-PROTECTED MULTIPROCESSOR SYSTEM WITH BROADCASTING OF SYMBOL-ERROR PROTECTED CODE WORDS

[75] Inventor: Thijs Krol, Eindhoven, Netherlands

[73] Assignee: U.S. Philips Corporation, New York, N.Y.

[21] Appl. No.: 918,985

[22] Filed: Jul. 23, 1992

[30] Foreign Application Priority Data

Aug. 8, 1991 [EP] European Pat. Off. ......... 91202040.1

[51] Int. Cl.$^5$ .............................................. G06F 11/00
[52] U.S. Cl. .................................... 395/575; 395/200; 364/265.2
[58] Field of Search .................. 395/575, 200; 371/36, 371/20.1; 364/131, 228.3, 268.2, 264.1

[56] References Cited

U.S. PATENT DOCUMENTS 4,884,194 11/1989 Krol et al. .
5,155,801 10/1992 Lincoln ................................. 395/22

Primary Examiner—Vincent P. Canney
Attorney, Agent, or Firm—Anne E. Barschall

[57] ABSTRACT

There is described a multimodule data processing system with N fully interconnected data processing modules for executing a Dispersed Joined Communication method according to a K-level nested and level-wise compartmentalized encoding, broadcasting and decoding operation. This allows for protecting against at most T maliciously operating modules, wherein $K=T+1$. At level K all said N modules are situated in a single compartment. At level $k=1$ for any extant message in any actual module such extant message is broadcast to all modules present in that message's compartment. For any level $K+1>k>1$ said operation previously comprises for any extant message generating therefrom $n>2T$ symbols according to a T-symbol error correcting encoding and within that message's actual compartment transmitting each of such n symbols as messages to a respective different module. Those different modules together constitute a next lower-level compartment for therein executing said operation according to next lower level k-1. At least one level $k>1$ comprises a data reducing encoding, or alternatively transmitting to less than all modules available for transmission thereto within the actual compartment. After such K rounds of information transmission said method comprises exclusively single-module-based and in such single module compartment-wise decoding according to successive levels (1 ... K) of any message or symbol present in the actual module.

8 Claims, 3 Drawing Sheets

INCONSISTENCY-PROTECTED MULTIPROCESSOR SYSTEM WITH BROADCASTING OF SYMBOL-ERROR PROTECTED CODE WORDS

FIELD OF THE INVENTION

The invention relates to a multiprocessor system, wherein messages are broadcast among the processors, and wherein a particular processor takes an error-protective decision as based on a plurality of messages that have been routed from a source processor to that particular processor along a plurality of respective intermediate processors. Multiprocessor systems are being developed in great variety. For the purpose of the present invention, the number of processors is at least equal to five, but there is no maximum. The processors are generally independent, in the sense that any processor assesses information received from any other processor in such a way that an incorrect assessment is dictated only by the receiving processor, but not by any other processor. The communication vehicle of the system may be a set of dedicated interconnections between respective processor pairs, a network organization, or any other organization provided that the capacity requirements specified infra are met. In such a system any processor is liable to break down and the system should remain operational under a condition that no more than T processors at a time would go out of operation. Usually, the number T is specified at a low value such as 1, 2 3 or 4. A particularly dangerous error category is represented by a processor that has an inconsistent behaviour, in that in case a message sent to more than one receiver, it reaches those receivers with mutually different contents. Such operation is called malicious.

BACKGROUND OF THE INVENTION

A system of the kind described has been published in U.S. Pat. No. 4,884,194 (PHN 11.120) to the same assignee, herein incorporated by reference. According to the reference, in successive broadcast steps, (T+1) in number, successive versions of a particular message are broadcast from a source processor to more or less geometrically increasing numbers of further processors or modules. Especially for higher values of T, this leads to an enormous traffic on the intercommunication system.

SUMMARY OF THE INVENTION

Among other things, it is an object of the present invention to provide a multiprocessor system of the kind described, wherein consistent behavior still exists in defiance of a limited number of at most T malfunctioning processors, but wherein the broadcast capability requirements are lower than according to the reference. In principle, there are two directions that may be taken for attaining the object. First, the number of messages may be restricted relative to the prescriptions of the reference. Second, the lengths of the messages may be kept smaller than the prescriptions of the reference. Further, those two features may be combined in various degrees. So, according to a first aspect, the invention provides a multimodule data processing system having N fully interconnected data processing modules for executing a Dispersed Joined Communication method according to a K-level nested and level-wise compartimentalized encoding, broadcasting and decoding operation, for protecting against at most T maliciously operating modules, wherein $K=T+b\ 1$, wherein at level K all said N modules are situated in a single compartment, and wherein at level $k-1$ said operation for any extant message in any actual module comprises broadcasting such extant message to all modules present in that message's compartment, and wherein for any level $K+1>k>1$ said operation previously comprises for any extant message generating therefrom $n>2T$ symbols according to a T-symbol error correcting encoding and within that message's actual compartment transmitting each of such n symbols as messages each to a respective different module, those different modules together constituting a next lower-level compartment for therein executing said operation according to next lower level $k-1$, and wherein at least one level $k>1$ comprises a data reducing encoding, and wherein after such K rounds of information transmission said method comprises exclusively single-module-based and in each such single module compartment-wise decoding according to successive levels (1 ... K) of any message or symbol. The number of messages according to the prior art increases roughly geometrically in each subsequent encoding step, while their lengths are uniform. Now, according to the data reducing encoding, for $T=1$, a message of 32 bits can be encoded into a four symbol code word of 64 bits. The hardware requirement would then be five modules. For $T=2$, a first level would require translating the 32 data bits into a six symbol, 96 bits code word. The second level would require broadcasting each received symbol to each one of five other modules in the compartment. In general, a data reducing encoding is defined herein as based on symbols that have a smaller length than the original message. In consequence, the total amount of data communication may be kept lower than that of the reference.

According to a second aspect of the invention, the object is attained by a multimodule data processing system having N fully interconnected data processing modules for executing a Dispersed Joined Communication method according to a K-level nested and level-wise compartimentalized encoding, broadcasting and decoding operation, for protecting against at most T maliciously operating modules, wherein $K=T+1$, wherein at level K all said N modules are situated in a single compartment, and wherein at level $k=1$ said operation for any extant message in any actual module comprises broadcasting such extant message to all modules present in that message's compartment, and wherein for any level $K+1>k>1$ said operation previously comprises for any extant message generating therefrom $n>2T$ symbols according to a T-symbol error correcting encoding and within that message's actual compartment transmitting each of such n symbols as messages each to a respective different module, those different modules together constituting a next lower-level compartment for therein executing said operation according to next lower level $k-1$, and wherein at least one level $k>1$ comprises transmitting to less than all other modules in said actual compartment, and wherein after such K rounds of information transmission said method comprises exclusively single-module-based and in such single module compartment-wise decoding according to successive levels (1 ... K) of any message or symbol. Although encoding is an efficient way to use as little data as possible, data multiplication is suitable as well. In reducing the number of broadcast operations to just the amount necessary according to the present invention, also less traffic is necessary. Of course, a feasible and attractive aspect of the invention would be that the two aspects supra would be combined.

Advantageously after said encoding, broadcasting and decoding operation of a subset of said N modules consisting of $N'>3T$ modules of which at most T are faulty, agreement has been attained, in each of at least $2T+1$ modules of said N' modules the locally decoded data is partially encoded and thereupon sent to all remaining $N-N'$ modules.

Now, in contrast to earlier embodiments, each of the N' modules calculates only one symbol and sends this to all modules in the set of $N-N'$ modules. Often, this process is quite efficient as considered from the number of broadcast operations, although it has to be paid for by an additional round.

Further advantageous aspects are recited in dependent Claims.

BRIEF DESCRIPTION OF THE FIGURES

The invention will be further explained with respect to the accompanying Figures that in particular illustrate.

Various tables elucidate advantageous aspects and embodiments.

DESCRIPTION OF A HARDWARE SET-UP

Figure 1:
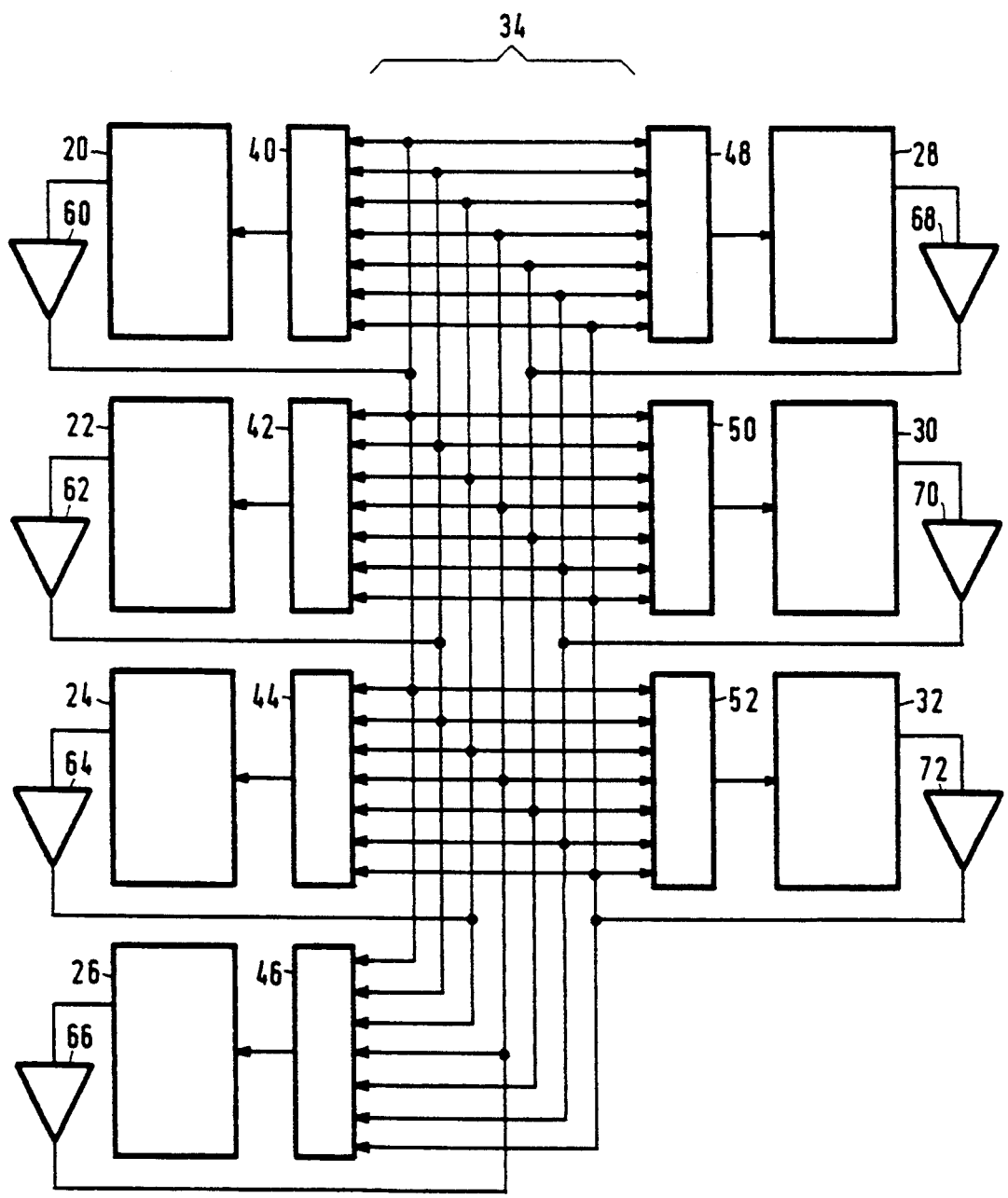
FIG. 1 is a diagram of a system according to the invention.

FIG. 1 is a diagram of a system according to the invention. There are seven data processing modules, which would cater for $T=2$ as will be explained hereinafter. Data processing module 20/40/60 has a local data facility that may comprise processing, storing, addressing input/output, user interfacing and other operations. Block 60 represents an output element for transmitting data/messages/symbols to the six other data processing modules. Such transmission may involve message set-up operations, by adding source address, destination address, generating a header, etcetera. The transmission may be as shown along a physical medium that is privy to a single source and connected to all destinations. Alternatively, a bus organization would be feasible, wherein all stations physically interface to the bus medium. Block 40 represents an input element that may have decoding/decision means for operating on messages/symbols as received and/or present in the module itself. Also retransmission of a symbol received along block 60 may be required. For simplicity, no synchronization mechanism has been shown.

No further discussion is offered with respect to the transmission protocol on the bit or message/symbol level, in particular, because such protocols are commonplace. Furthermore, no extensive explanation is given on a data reducing encoding, inasmuch as such codes have been extensively published. Reed-Solomon codes, in particular shortened versions thereof would be suitable. The set-up shown in FIG. 1 is modular. Extension would be feasible to a desired degree.

DESCRIPTION OF THE STRATEGY

Now, we will consider the problem of N communicating modules with independent data links between the modules. Among these modules T or less are behaving maliciously, possibly by transmitting conflicting information to different parts of the network, i.e. generating broadcast errors. Whenever a module transmits a message to all other modules, or possibly conflicting messages when it is malfunctioning, we define that the dispersed joint communication requirements (DJC) are fulfilled if:

The well-functioning modules agree among each other on the data they think they have received from the source.

If the source is well-functioning, the above-mentioned agreement should equal the data actually sent by the source.

There is a bound $N>3T$ for synchronous systems without authentification. In the following we will present a class of synchronous deterministic methods which solves the problem for all values $N \geq 3T+1$ and $K=T+1$. This class is based on voting and error-correcting codes will be called Dispersed Joined Communication. In the new class of methods, the amount of data which needs to be transmitted between the modules is reduced considerably compared with the existing synchronous deterministic non-authenticated methods.

Firstly by reducing the number of directions in which a message is forwarded and secondly by replacing the broadcast functions by the encoder functions of error-correcting codes and simultaneously replacing the voting function in the decision-making process by the decoder functions of the error-correcting codes applied in the broadcast process.

This class of methods contains a subclass which is based on voting. In this subclass the only functions applied are broadcasting data and majority votes on data. However, the broadcast function is replaced by the encoding function of an error-correcting code and the majority vote by the corresponding decoder function of the error-correcting code.

Let a system be composed of N fully interconnected modules. So between any two modules a communication channel is available in both directions. Due to these individual channels between the modules, a receiving module that behaes correctly, always 'knows' which module has inserted data on the input side of the channel, regardless of whether the sending module behaves correctly or maliciously. The modules are identified by the elements of the set Ns. So $|Ns|=N$. At most T of the modules in the system are allowed to behave maliciously.

The method will transmit a message from a particular source to a number of destinations. The method prescribes the rules and formats for communications on the network and the operations performed on the messages in the: modules.

On the other hand, the input is the original message in the source and the outputs are the decisions (estimates) calculated by the destinations about what the source tried to send to them.

So a method has both topological and behavioural aspects, i.e.:

Topological aspects provide information about the source module, the set of destinations and the way a message is routed through the network from the source to the destinations.

Behavioural aspects provide information about the functions performed in the modules on the messages before they are forwarded to the next module and the functions which are performed in order to calculate the decision in the destinations.

We restrict ourselves to synchronous deterministic operations. This means that the modules in the system run synchronously and have a common notion of time. Moreover the number of rounds of the method is fixed. The number of time instances used is $K+1$, hence the method comprises $K+1$ rounds synchronously executed by the modules. These rounds are enumerated $0,1, \ldots K$.

For convenience the method is divided into two parts:

a broadcasting process which comprises the rounds $0, \ldots, K-1$.

a decision-making process which is executed during round K and in which the result is calculated in each module.

Each round of the broadcasting consists of two parts:

1. A number of combinatorial functions is applied on the data received in the previous round in each module, one for each module to which a result will be sent. Such a function may depend on:

the module in which it is executed,
the round number, and
the destination to which the result is sent.

2. The exchange of data between the modules.

During the last round, i.e. the decision-making process, no information exchange takes place. The method thus comprises K rounds of information exchange.

THE BROADCASTING PROCESS

Data sent from one module to another during a particular round is divided into a number of messages. Each message is treated individually by a module. Functions are only applied on a single message and the result of the function is again a single message. Clearly in a particular module during a particular round more than one function may be applied on the same incoming message resulting in more than one outgoing message, but during that round all these messages will be sent in different directions. This means that a message which is received during a particular round can only cause single messages to be sent in different directions. Conversely, if a message is transmitted from a first module to a second, then this is always caused by a message which in the previous round had been received by the first module. Thus no messages are generated spontaneously. Also the original message available in the source at the beginning of round 0 is regarded as having been received during the previous round. Consequently, the messages can be identified by the path they had travelled through the network. For example, a message which originated in module a and which after modification by a function was sent to module b, and again after modification was sent to module c, is identified by the string (path) (a,b,c). Only $K+1$ time instances are taken into account which encompass K rounds of information exchange. So messages are identified by elements of the set of all strings of length $K+1$ or less over the set of module identifiers Ns. A string will be denoted by a symbol like s. Messages are not forwarded in all directions, therefore we define a function B on the set of all strings of length K or less over Ns, such that B(s) is the set of modules to which the message which is identified by s, is sent after modification.

The values of the messages are represented as a function m on the set of message identifiers. So m(s) is the message which is identified by a and m(a,b,c) is the message (=message value) which is received during round 1 by module c from module b and which travelled from module a via module b to module c.

THE DECISION-MAKING PROCESS

The decision-making process acts independently in each module on the messages which are received by that module during the entire broadcast process. In the method, the results of the calculations performed in each module by the decision-making processes have to fulfil the interactive consistency requirements.

The Dispersed Joined Communication

The methods for Dispersed Joined Communication (DJC) aim to transmit a message from a single source module to a number of destinations in the presence of a number of maliciously behaving modules.

In order to allow for modules which behave maliciously, the communication between the source and the destinations is dispersed, i.e. the message to be transmitted is sent, possibly in differently modified versions, via different paths from the source to the destinations. The method prescribes the way in which the message is forwarded through the network from the source to the destinations, the way in which the messages are modified by the modules, and the way in which the final result is calculated in the destinations. Although the message passing is dispersed, the message passing and modification for different destinations is joined as much as possible, i.e. for any two destinations d and e, it holds that all paths from the source to these destinations are shared as much as is compatible with the additional requirement that a message is never relayed to a module that it has already passed. This means that the set of directions B(rt) into which a module will forward a message s it had received in the previous round does not depend on its final destinations, but only on the path followed hitherto.

Now, in particularly well-defined circumstances correctly functioning modules might arrive at different decisions. To be more precise, DJC satisfies the following behavioural properties:

If the source and destination are both functioning correctly, then the decision calculated by the decision-making process in the destination module equals the original message in the source.

For a method which is based on K rounds of information exchange and which aims at communicating a message from a source module to a number of destinations, it will hold that if the result calculated in two correctly functioning destinations is different, then a message has travelled along a path of length K from the source module a to these destinations consisting of K different modules which all (the source module a inclusive) behave maliciously.

A sub-class of DJC will define a new class that is based on young and coding. Moreover the solving of the Input Problem will be based on DJC.

Dispersed Joined Communication is defined on a set Ns of fully interconnected modules. Such method sends from a particular source module to a set of destinations, by means of K rounds of information exchange.

Figure 2:
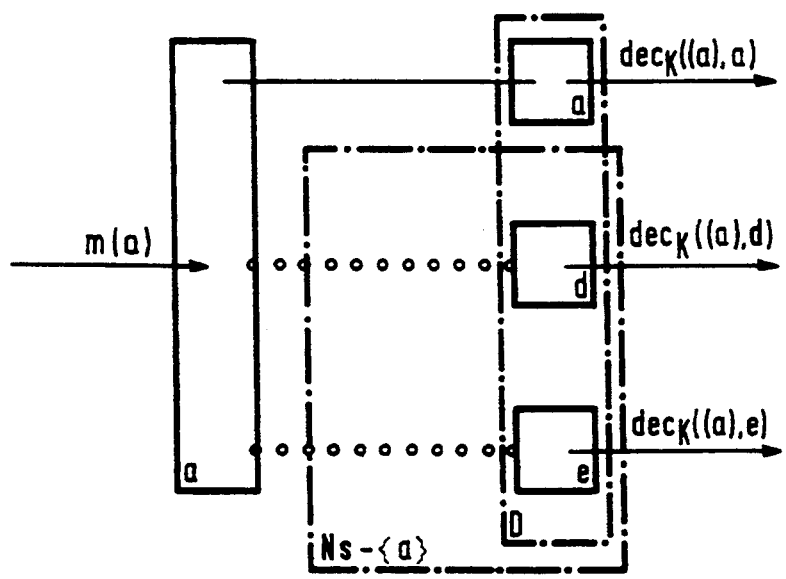
FIG. 2 represents the operation in class A(T, K, a, Ns)

Now, FIG. 2 is a pictorial representation of a process in the class A(T, K, a, Ns). Direct communication is indicated by —, communication via other modules by o o o.

Therefore we define classes A (T, K, a, Ns) of DJC methods in which:

T is the maximum number of maliciously behaving modules which is tolerated.

K is the number of rounds of information exchange.

a is the source module of the algorithm.

Ns is the set of modules in the system.

Obviously these classes A(T, K, a, Ns) of DJC are only defined if $K > 1$ and $a \in Ns$.

A particular method in a class A(T, K, a, Ns) lays down in detail the way in which a message travels from the source a to the destinations d in Ns via different parallel paths in K rounds of information exchange. Moreover the method prescribes the way in which the messages are modified during their journey though the network and the way in which in each destination d, a decision is calculated starting from all data received by d.

A method in the class A(T, K, a, Ns) forwards the original message in the source module in K rounds of information exchange to the destinations in Ns. The original message in the source is denoted by m(s,a) or by m(a).

The prefix s to the source module identifier a is only used if we need to distinguish between different messages in the same module a and in that case denotes the path along which the message did travel to module a.

If a message m(s,a) or m(a) is sent to the modules in the set Ns by means of a method from the class A(T, K, a, Ns), then the results calculated in the modules d are denoted by $dec_K((s,a),d)$ or by $dec_K((a),d)$ with $d \in Ns$ We do not use an explicit single expression for the relation between the input value m(a) and the output value $dec_K((a),d)$. In order to elucidate the difference between an explicit and an implicit description, we consider the following example.

Suppose a class of systems S consists of two concatenated modules identified by a and b. The input value to a is denoted by x, the value sent from a to b by y, and the output value of b is denoted by z. In module a a function f is executed which belongs to a class of functions F and in module b a function g is executed which belongs to a class of functions G. The explicit definition of the class of systems S is as follows:

Let S be a class of systems with input value x and output value z, the relation between x and z is defined by $z = s(x)$ in which $s = g \circ f$, and f is a function from the class F, and g is a function from the class G.

The implicit definition of the class of systems S is as follows:

Let S be a class of systems with input value x and output value z. The systems in the class S are composed of two modules a and b. In module a a function from the class F is executed on its input value x and the result is forwarded to module b. In module b a function from the class G is executed on the value received from a. The result is called z.

Both the explicit and the implicit description define the behavioural aspects of the system equally well. However, the latter (implicit) definition provides additional topological information about the system. This topological information is important and we will apply the implicit way of defining DJC.

The Construction of the Dispersed Joined Communication Methods

Let a system be composed from a number of fully interconnected modules. At most T of the modules in the system are allowed to behave maliciously.

The algorithms in the classes A(T, K, a, Ns) will be defined recursively with respect to K. The basis of the recursion is the case $K = 1$.

The Construction in the Class A(T, 1, a, Ns)

A method in the class A(T, 1, a, Ns) is based on only one round of information exchange. Herein, a denotes the source module and Ns denotes the set of modules in the system.

Moreover, classes A(T, 1, a, Ns) of DJC are only defined if $a \in Ns$ and $Ns \geq 2$. These restrictions concern the topological aspects of the class.

Figure 3:
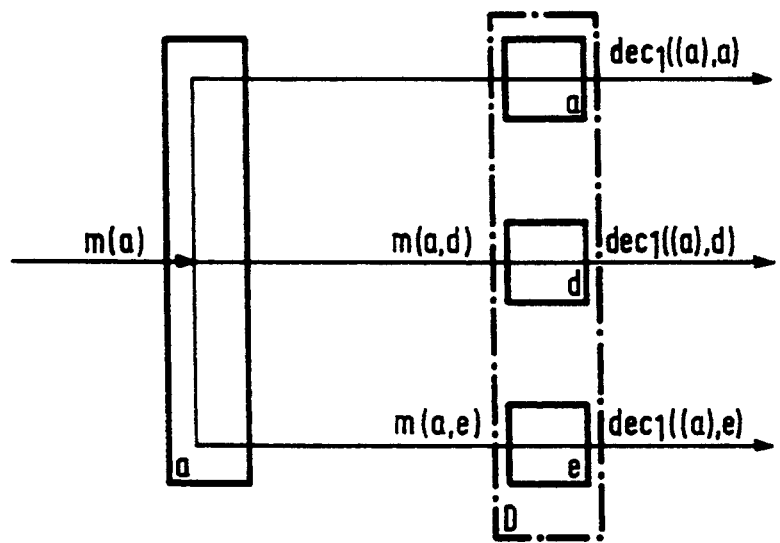
FIG. 3 represents the operation in class A(T, 1, a, Ns)

Under the given conditions the class A(T, 1, a, Ns) contains the following:

During round 0, the source module a sends the original message m(a) directly and unchanged to all modules in $Ns - \{a\}$. If $a \in Ns$ then module a keeps a copy of the message m(a) itself in order to be used in the decision-making process during round 1. The messages recived by the modules d in $Ns - \{a\}$ from module a are denoted by m(a,d), FIG. 3.

During round 1 the decision-making process is executed in which in each module d, with $d \in (Ns - \{a\})$, the message m(a,d) received from a is taken as decision $dec_1((a),d)$ and if $a \in Ns$ then the decision $dec_1((a),a)$ in module a will be equal to the stored message m(a).

So the behavioural aspects in the class A(T, 1, a, Ns) (starting from correctly functioning modules) are:

$d \in (Ns - \{a\}) \rightarrow m(a,d) = m(a)$ $a \in Ns \rightarrow dec_1((a),a) = m(a)$ $d \in (Ns - \{a\}) \rightarrow dec_1((a),d) = m(a,d)$

The Recursive Construction in the Class A(T, K, a, Ns) with $K > 1$ in Terms of Classes A(T, K−1, b, Ns−({a}) with $b \in Ns$ The original message in a source module is denoted by m(a); the result of a DJC from the class A(T, K, a, Ns) calculated in a module d with $d \in Ns$ is represented by $dec_K((a),d)$.

The construction of the methods in the class A(T, K, a, Ns) with $K > 1$ will be based on encoding the original message m(a) in the source into symbols of a T-error-correcting code, thereafter transmitting each symbol to a different module b, which forwards the received symbols to the destinations by means of a method from the class A(T, K−1, b, Ns−{a}).

Therefore let $Y_{(a)}$ be the encoder function of some T-error-correcting code of which the code words consists of $n_{(a)}$ symbols of size $b_{(b)}$ and of which the data words consists of $k_{(a)}$ symbols. The corresponding decoder function is denoted by $Y_{(a)}^{-1}$). Suppose the original message m(a) consists of $k_{(a)}$ symbols and the symbol which is sent to b is denoted by m(a,b), then this symbol is related to m(a) by $m(a,b) = Y_{(a)}(b)(m(a))$ in which the $Y_{(a)}(b)$ is called the partial encoder function of the encoder function $Y_{(a)}$ which delivers the symbol which has to be sent to module b.

Figure 4:
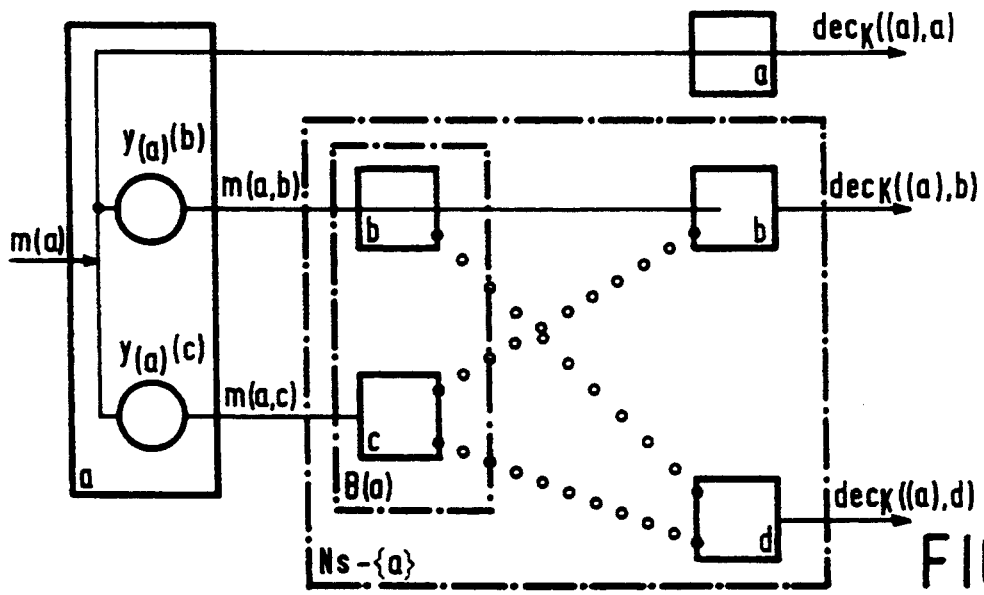
FIG. 4 reresents the compartimentation in class A(T, K, a, Ns)

Now we can define the DJC method in the class A(T, K, a, Ns) with $K > 1$. First, FIG. 4 is a representation of the construction in the class A(T, K, a, Ns). The DJC in the class Aft, K, a, Ns) with $K > 1$ are constructed as follows:

1. During round 0
   (a) If the source module is one of the destinations, thus a ε Ns, the original message m(a) in the source is kept stored in the module in order to be used later on during round K in the decision-making process,
   (b) Furthermore in the source module a a number of partially encoded versions m(a,b) of the original message m(a) are calculated such that $m(a,b) = Y_{(a)}(b)(m(a))$.
   (c) Thereafter each of these versions m(a,b) of the original message is sent to a different module. These modules ar indicated by the next-set B(a). So b ε B(a). The number of modules b to which the partially encoded messages are sent must be at least $2T+1$.

2. During the rounds 1, ... K, each module b in the next-set B(a) forwards the received partially encoded message m(a,b) to the destinations indicated by Ns−{a} by means of an algorithm from the class A(T, K-1, b, Ns−{a}). The results of these algorithms in the destination d ε (Ns-{a}) are denoted by $dec_{K1}((a,b),d)$. These results are calculated during the first part of the decision-making process which is executed in round K.

3. During the second pan of the decision-making process which is executed during round K, the decision $dec_K((a),d)$ in the modules d with d ε (Ns−{a}) is obtained by applying the decoder function $Y_{(a)}^{(-1)}$ on the results $dec_{K-1}((a,b),d)$ with b ε B(a). If a ε Ns then the decision $dec_K((a),a)$ is obtained by taking the message value m(a) which had been kept stored in module a, cf. FIGS. 5 and 6.

Figure 5:
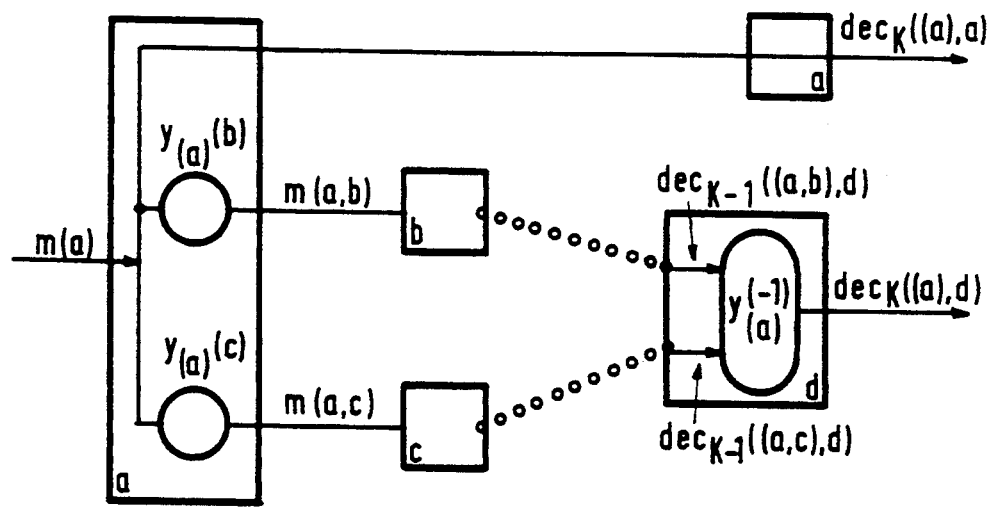
FIG. 5 represents the decision in a module d not in B(a) from partially encoded messages.
Figure 6:
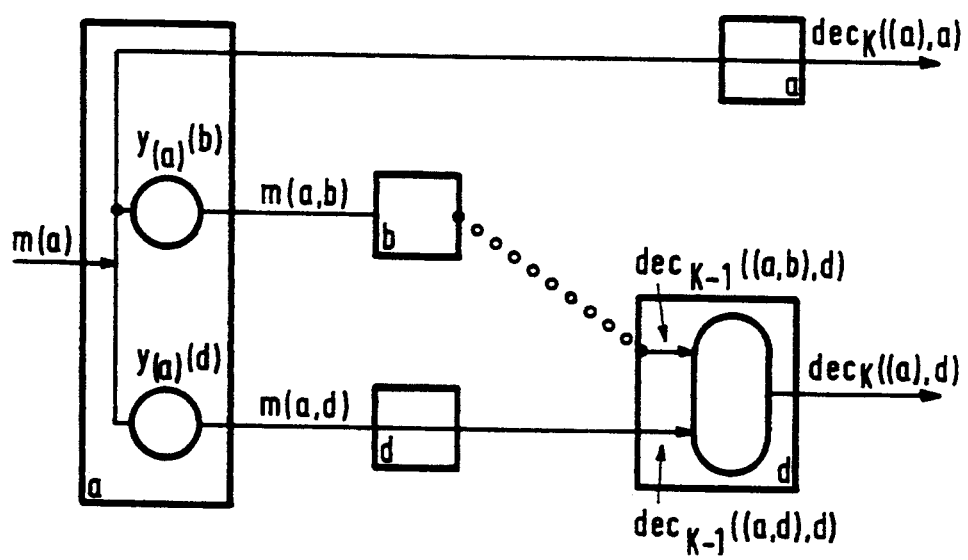
FIG. 6 represents the decision in a module d within B(a) from partially encoded messages.

In the above, FIG. 5 is a representation of the way in which the decision $dec_K((a),d)$ in a module d with d not ε B(a) is obtained from the partially encoded messages sent by module a to the modules B(a), and FIG. 6 is a corresponding situation for d ε B(a).

The class A(T, K, a, Ns) requires K rounds of information exchange, while the class A(T, K-1, b, Ns−{a}) requires K-1 rounds of information exchange. The latter are preceded by the round in which the partially encoded messages are sent from a to b. So round t, with $1 \leq l \leq K$, of the class A(T, K, a, Ns) corresponds to round t-1 of the class A(T, K-1 b, Ns-{a}). And thus the calculation of the decisions $dec_{K-1}((a,b),d)$ in a module d ε (Ns-{a}) precede the calculation of the decisions $dec_K((a),d)$ during the same round K.

During round K, with $K \geq 2$, a module b in general receives more than one message $m(s_i,b)$, which arrives from the source module a via different paths $s_i$. Each of these messages is dealt with by b separately. If $t \leq K-2$, they are each encoded by means of an encoder function that depends on $s_i$ and thereafter forwarded to destinations which are determined by the set $B(s_i,b)$ which depends on $s_i$. How module b discriminates between the messages it receives is a matter of implementation and will not be further commented on.

The construction described above is possible if and only if

A next-set B(a) can be found which is a subset of Ns-{a} and which contains at least $2T+1$ modules.

A T-error-correcting code exists of which the code words consist of |B(a)| symbols.

The classes A(T, K-1, b, Ns-{a}) of DJC with b ε B(a) are all non-empty.

The behavioural in the class A(T, K, a, Ns) is summarized as follows:
$m(a,b) = Y_{(a)}(b)(m(a))$ for all b ε B(a)

$dec_{K1}((a,b),d)$ follows from m(a,b) based on an element from the class Aft, K-1, b, Ns-{a})

$d \neq a \rightarrow dec_K((a),d) = Y_{(a)}^{(-1)}$ applied on the values $dec_{K1}((a,b),d)$ with b ε B(a)

$d = a \rightarrow dec_K((a),d) = m(a)$.

Dispersed Joined Communication in the Classes A(T,K, a, Ns)

The next step is to investigate for which parameters the classes A(T, K, a, Ns) are non-empty. These classes are only defined if $K \geq 1$ and a ε Ns and $Ns \geq K+1$
If these constraints are not satisfied a class A(T, K, a, Ns) is empty.

The non-emptiness of the classes A(T, K, a, Ns) only depends on the number of modules in the system |Ns|, the number of rounds K and the number T of faults which is to be tolerated.

For all T with $T \geq 1$ and
for all K with $K \geq 2$ and
for all fully interconnected systems consisting of |Ns| modules, and
for all source modules a in the system, it holds that the class of methods A(T, K, a, Ns) is non-empty if and only if $|Ns| \geq 2T+K$.

A Further Class of Methods Based on Voting and Coding

This class immediately follows from the Dispersed Joined Communication methods defined earlier.

Let a system consist of N modules identified by the elements of a set Ns. At most T modules in this set behave maliciously. Then the classes of Interactive Consistency methods among the classes of DJC are those in which the set of destinations encompasses the entire system and the number of rounds is one more than the number of maliciously behaving modules which need to be tolerated, i.e. the classes:
A(T, K, a, Ns) with $T \geq 1$ and $K = T+1$ A class of DJC methods A(T, K, a, Ns) is non-empty if and only if $|Ns| \geq 2T+K$ Therefore, an interactive consistency procedure based on voting and decoding can always be constructed if
$T \geq 1$ and $N \geq 3T+1$ and $K = T+1$ The interactive consistency in a class A(T, T +1, a, Ns) satisfies the interactive consistency requirements, as given earlier.

Generally the reduction of the number of messages which needs to be transmitted between the modules can be obtained in two ways, i.e.:

by minimizing the number of directions in which the messages are broadcast each round, and by replacing the voting function by an error-correcting code.

From the construction we immediately see that replacing the voting function by an error-correcting code causes an increase in the number of modules to which a modified message has to be sent. However, the size of the messages to be transmitted decreases compared to the original message in the source. In the next chapter we will show that choosing an error-correcting code is more efficient than reducing the number of directions in which a message is sent each round. The advantage of fewer messages to be transmitted due to the application of non-trivial error-correcting, has to be paid for by a larger minimal size of the original message in the source and by the fact that the implementation of the decoding function of an error-correcting code is more complex than a simple majority voter.

For these reasons we will define in two subclasses i.e.

The Minimal Voting methods. In this class the number of directions in which a message is sent in each round, is minimized and in the decision-making process only majority voting is applied.

The Maximal Coding methods. In this class the messages are broadcast to as many modules as is allowed by the definition of DJC algorithms, such that the amount of redundancy in an error-correcting code word is as little as possible and the size reduction of the messages in each step is maximal.

Another way of minimizing the amount of messages is to reduce the amount of destinations in which the decisions are calculated and thereafter to broadcast the results in an additional round to the other modules. This Subset Method will be discussed at the end.

We want to design an IAC method for a system consisting of N modules of which at most T may behave maliciously. This is always possible if $T \geq 1 \cap N \geq 3T+1 \cap K=T+1$ From the definition of IAC on voting and coding we know that the source module a communicates the original message m(a) by means of a DJC method from the class A(T, KI, a, Ns) with T=K+1 to all modules in Ns. The source module in this case is always one of the destinations and thus the original message m(a) is kept stored in the source module. The decision $dec_K((a),a)$ in the source equals the original message m(a), which has been kept stored in the source until round K.

The source module a communicates the original message m(a) to the other modules, i.e. the modules in Ns−{a}, as follows: Module a sends during round 0 (modified) messages m(a,b) to a number of modules identified by the next-set B(a). Thus b ∈B(a). Notice that B(a)⊂(Ns−{a}) and thus the number of elements in B(a) is at most N−1. The modified messages which are forwarded by module a are partially encoded copies of the original message. The choice of the T-error-correcting code $Y_{(a)}$ which is used in module a for encoding is limited by the number of modules to which symbols can be sent, i.e. the number $n_{(a)}$ of symbols of a code word of the T-error-correcting code equals |B(a)| and thus may be at most N−1. Furthermore T-error-correcting codes consisting of code words of $n_{(a)}$ symbols exist if and only if $n_{(a)} \geq 2T+1$, provided the symbol size $b_{(a)}$ is sufficient large. So $2T+1 \geq n_{(a)} \geq N-1$ Obviously for T=1 and N=4, i.e. the most simple IAC algorithm, no choice is left. but in all other cases a code can be freely chosen within the preceding constraint.

Further, we know that each message m(a,b) received by a modules b, wit b ∈ B(a) is communicated to the destinations d in the set Ns−{a}, by means of a member from the class A(T, K−1, b, Ns−{a}), in which K−1=T.

The method from the class A(T, T, b, Ns−{a}), with b ∈ B(a) will after encoding again forward the message m(a,b) to the modules c with c ∈ B(a,b). In this B(a,b) is the next-set which belongs to the class A(T, T, b, Ns−{a}).

Clearly the module b will be one of the destinations, so the message m(a,b) will also be kept stored in module b and become the decision $dec_{K-1}((a,b),b)$ during round K.

The messages which are received during round 1 by the module c, with c ∈ B(a,b), are denoted by m(a,b,c).

These messages m(a,b,c) are again communicated to the modules d in the sets Ns−{a,b} by means of an element from the class A(T, T-1, c, Ns−{a,b}). Because c ∈ B(a,b) and B(a,b)⊂Ns−{a,b} the module c also will be one of the destinations and therefore the message m(a,b,c) will also be kept stored.

In a particular module c more than one message may arrive. For example, suppose that the messages m(a,$b_1$,c) and m(a,$b_2$,c) arrive in module c. Thus $b_1$,$b_2$ ∈ B(a), and c ∈ B(a,$b_1$), and c ∈ B(a,$b_2$). In that case the choices from the classes A(T, T−1, c, Ns−{a,$b_1$}) and A(T, T−1, c, Ns−{a,$b_2$}) for forwarding the messages m(a,$b_1$,c) and m(a,$b_2$,c) may be made independently. This process is continued until the last round of information exchange, i.e. round K−1. During this round each message m(a,s,p) which arrives in a module p, is forwarded to the destinations in the set Ns-set(a,s) by means of the only element in the class A(T, 1, p, Ns-set(a,s)). Herein set(a,s) denotes the set of modules from which the string (a,s) is composed.

In consequence, a particular method in the class A(T, K, a, Ns) is fully determined by the choice of the set B(a),
the choice of the code $Y_{(a)}$, and
for each module b with b ∈ B(a), the choice from class A(T, K−1, b, Ns−{a}) by means of which the message m(a,b) is forwarded to the destinations in Ns−{a}.

Similarly a particular method in the class A(T, K-t, p, Ns-set(a,s)), with |(a,s)|=t, which is utilized by a method from the class A(T, K, a, Ns) for forwarding a message m(a,s,p) is fully determined by the choice of the set B(a,s,p),
the choice of the code Y(a,s,p), and
for each module q with q ∈ B(a,s,p), the choice of the process from the class A(T, K-t-1, q, Ns-set)a,s,p)) by means of which the message m(a,s,p,q) is forwarded to the destinations in Ns-set(a,s,p).

For each message m(a,s,p) the choice from the class A(T, K-t, p, Ns-set(a,s)) may be independent.

Not every string of length K+1 or less over the set Ns will identify a message caused by a particular method. Therefore, let Sm be the set of all strings which identify messages which result from a particular element from the class A(T, K, a, Ns), then Sm will be determined by (a) ∈Sm ((s) ∈SM ∩ p ∈ B(s))→(s,p) ∈ Sm Clearly the sets B(s), are only defined for $1 \leq |s| \leq K$ and s ∈ Sm.

The set B(s,p) amongst other things determines a particular element in the class A(T, K-t, p, Ns-set(s)), with |s|=t, which is utilized by an element from the class A(T, K, a, Ns) for forwarding a message m(s,p). This set B(s,p) will have to satisfy the rules imposed earlier:

((s,p)∈SM ∧ 1≤ | (s,p) | <K−1)→((B(s,p)⊂(Ns-set(s,p))

∧(2T+1≤ | B(s,p) | ≤ | Ns-set(s,p |))

The last round of information exchange during the broadcasting process is determined by the classes A(T, 1, p, Ns-set(s)), with |s |=K−1. These forward the messages directly to the destinations. So for these the next-set is defined by ((s,p)∈Sm ∧ | (s,p) | =K)→B(s,p)=(Ns-set(s,p))

It therefore follows that a particular element in the class A(T, K, a, Ns) is fully determined by the sets N(s)

with s ∈ Sm and the T-error-correcting codes $Y_{(s)}$ with s ∈ Sm and $1 \leq |s| \leq K-1$.

The Decision-Making Process

From the foregoing of the DJC methods in a class A(T, K-t, p, Ns-set(s)), with $|s|=t$, the decision-making in the "source module" p only consists of taking the message m(s,p) which had been kept stored since round t. Thus $dec_{K-t}((s,p),p) = m(s,p)$ The decision-making in module d, with d ∈ (Ns-set(s,p)) encompasses the $n_{(s,p)}$ decision-making processes chosen from the class A(T, K-t-1, q, Ns-set(s,p)), with q ∈ B(s,p) followed by the execution of the decoder function, $_{(s,p)}Y^{(-1)}$ cf. FIGS. 5 and 6.

So the decision-making process executed by an element from the class A(T, K, a, Ns), in a module d during round K starts with the calculation of the results $dec_1$ (u,p,q),d) of the elements chosen from the classes A(T, 1, q, Ns-set(u,p)), which forwarded the messages m(u,p,q) to module d in the set Ns-set(u,p). Obviously (u,p,q) ∈ Sm and any string u starts with a.

The decision $dec_1$ ((u,p,q),d) with p≠d equals the message m(u,p,q,d) received by module d during round K-1. Because the message m(u,p,q) is communicated to the destinations in Ns-set(u,p) it holds that q is one of the destinations. So d ∈ B(u,p). And according to the construction, $dec_1$(u,p,d),d) equals the message m(u,p,d) received by module d during round K-2.

So for all destinations d with d ∈ (Ns-set(u,p)) it holds that:

q≠d→$dec_1$(u,p,q),d)=m(u,p,q,d)$dec_1$((u,p,d),d)=-m(u,p,d)

So in all destinations d represented by Ns-set(u,p), the decisions $dec_1$((u,p,q),d) can be calculated.

After the calculation of the decisions $dec_1$(u,p,q),d) in the modules d in Ns-set(u,p), the decisions $dec_2$(u,p),d) of the elements from the classes A(T, 2, q, Ns-set(u)), which communicated the messages m(u,p) to modules d in Ns-set(u), are calculated in these modules d from Ns-set(u).

If d=p the decision $dec_2$((u,p),d) equals the message m(u,p) which was kept stored in module p. So what remains to be shown is the calculation of the decisions in the module d in Ns-set(u,p).

The modules q to which the message m(u,p) is sent after encoding are determined by the set B(u,p). In all modules d with d ∈ (Ns-set(u,p)) decisions $dec_1$. ((u,p,q)d) have been calculated first.

So in these modules d for each message (m(u,p) received by module p a number of $n_{(u,p)}$ decisions $dec_1$ ((u,p,q),d) are availabe with q ∈ B(u,p). The decoder function $Y_{(u,p)}^{(-1)}$ is applied to these decisions, which results in the decisions $dec_2$(u,p),d)

The decisions $dec_2$((u,p),d) which have been calculated thus far in the modules d in Ns-set(u), could be regarded as estimates calculated by the modules d the message value m(u,p) received by module p during round K-3.

The first round of applying decoder functions $Y_{(u,p)}^{(-1)}$, together with $dec_2$(u,d),d), delivers for each u a number of $n_{(u)}$ decisions $dec_2$(u,p),d) with p ∈ B(u) and d ∈ (Ns-set(u)). The decoder function $^{(-1)}Y_{(u)}$ is applied to these decisions, which results in the decisions $dec_3$(u),d).

This process is continued until $dec_K$((a),d) has been calculated by means of the decoder function $Y_{(a)}^{(-1)}$ for d≠a and $dec_K$((a),a) is obtained from m(a).

Two Preferred Examples

The first example concerns an element from the class A(2, 3, 0, Ns) with Ns={0, 1, . . . , 6}. Thus T=2, K=3, and N=7. The sets, the messages and the decision-making process are given in the Tables 1, 2 and 3. This example again meets the 3T+1 bound and the K+1 bound. The example provides some design freedom.

Table 1 shows the sets B(s). The source transmits its message to a number of modules which is determined by the code. The sets Sm and B(o,a) can be easily found. The messages m(s) with s ∈ Sm are shown in Table 2. Notice that a message m(0, 1) represents the message received at the end of round 0 by module 1 from module 0. The data depencency between the messages is indicated in the Figure by →|. For example m(0,1)→|m(0,1,2) indicates that the message m(0,1,2) received by module 2 from module 1 is obtained from m(0,1) by applying a partial encoding function on m(0,1).

The next-set B(0) should be contained in the set {1, . . . ,6}. Moreover this next-set must contain at least 2T+1=5 modules. Hence we may choose between 5 and 6 modules. The first choice would again imply a repetition code and therefore we choose B(0)={1, . . . , 6}. T-error-correcting codes can always be constructed with $n_{(0)}=k_{(0)}+2T$ and any symbol size of $b_{(0)} \geq \log_2(n_{(0)}-1)$ bits in which $n_{(0)}$ is the number of symbols of code word and $k_{(0)}$ is the number of symbols of data word. Hence a code with $n_{(0)}=6$, $k_{(0)}=2$, and $b_{(0)}=3$ suffices. It follows that the minimum size size of the original message in the source is 6, i.e. 2 symbols of size 3.

During round 0, in the source module 0, the original message is encoded into 6 symbols of 3 bits. Each of these symbols is sent to a different module

TABLE 1

| The next-sets |  |  |
|---|---|---|
| N = 7 T = 2 K = 3 |  |  |
| Ns = {0,1,2,3,4,5,6} |  |  |
| B(0) = {1,2,3,4,5,6} | B(0,1) = {2,3,4,5,6} | B(0,,1,2) = {3,4,5,6} |
|  |  | B(0,1,3) = {2,4,5,6} |
|  |  | B(0,1,4) = {2,3,5,6} |
|  |  | B(0,1,5) = {2,3,4,6} |
|  |  | B(0,1,6) = {2,3,4,5} |
|  | B(0,2) = {1,3,4,5,6} | ... |
|  | B(0,3) = {1,2,4,5,6} | ... |
|  | B(0,4) = {1,2,3,5,6} | ... |
|  | B(0,5) = {1,2,3,4,6} |  |
|  | B(0,6) = {1,2,3,4,5} | B(0,6,1) = {2,3,4,5} |
|  |  | B(0,6,2) = {1,3,4,5} |
|  |  | B(0,6,3) = {1,2,4,5} |
|  |  | B(0,6,4) = {1,2,3,5} |
|  |  | B(0,6,5) = {1,2,3,4} |

TABLE 2

| The messages |  |  |
|---|---|---|
| N = 7 T = 2 K = 3 |  |  |
| m(0,1)→ | m(0,1,2)→ | m(0,1,2,3) |
|  |  | m(0,1,2,4) |
|  |  | m(0,1,2,5) |
|  |  | m(0,1,2,6) |
|  | m(0,1,3)→ | m(0,1,3,2) |
|  |  | m(0,1,3,4) |
|  |  | m(0,1,3,5) |
|  |  | m(0,1,3,6) |
|  | m(0,1,4)→ | ... |
|  | m(0,1,5)→ | ... |
|  |  | m(0,1,6,2) |
|  |  | m(0,1,6,3) |
|  | m(0,1,6)→ | m(0,1,6,4) |

TABLE 2-continued

| The messages N = 7 T = 2 K = 3 | | | |
|---|---|---|---|
| m(0)→ | m(0,2)→ m(0,3)→ m(0,4)→ m(0,5)→ | ... ... ... ... | m(0,1,6,5) |
| | | m(0,6,1)→ | m(0,6,1,2) m(0,6,1,3) m(0,6,1,4) m(0,6,1,5) |
| | m(0,6)→ | m(0,6,2)→ m(0,6,3)→ m(0,6,4)→ | ... ... ... |
| | | m(0,6,5)→ | m(0,6,5,1) m(0,6,5,2) m(0,6,5,3) m(0,6,5,4) |

TABLE 3

The decision-making process
N = 7 T = 2 K = 3

```
m(0)                                                          → dec3((0),0)
m(0,1)                           → dec2((0,1),1)
m(0,2,1) → dec1((0,2,1),1)
m(0,2,3,1) → dec1((0,2,3),1)
m(0,2,4,1) → dec1((0,2,4),1)     → dec2((0,2),1)
m(0,2,5,1) → dec1((0,2,5),1)
m(0,2,6,1) → dec1((0,2,6),1)
m(0,3,1) → dec1((0,3,1),1)
m(0,3,2,1) → dec1((0,3,2),1)
m(0,3,4,1) → dec1((0,3,4),1)     → dec2((0,3),1)
m(0,3,5,1) → dec1((0,3,5),1)
m(0,3,6,1) → dec1((0,3,6),1)
   ...                            → dec2((0,4),1)             → dec3((0),1)
   ...                            → dec2((0,5),1)
m(0,6,1) → dec1((0,6,1),1)
m(0,6,2,1) → dec1((0,6,2),1)
m(0,6,3,1) → dec1((0,6,3),1)     → dec2((0,6),1)
m(0,6,4,1) → dec1((0,6,4),1)
m(0,6,5,1) → dec1((0,6,5),1)
   ...                                                        → dec3((0),2)
   ...                                                        → dec3((0),3)
   ...                                                        → dec3((0),4)
   ...                                                        → dec3((0),5)
   ...                                                        → dec3((0),6)
``` of the set B(0). Thereafter during the rounds 1 and 2 these symbols are forwarded to the destinations by means of elements from the classes A(2,2,a,Ns-{0}). The next-sets B(0,a) can be easily derived as:

B(0,a)⊂(Ns-{0,a})
2T+1≦|B(0,a)|≦|Ns-{0,a}|

Because |Ns|=7 and T=2 the only choice left for B(0,a) is Ns−{0,a} and the only choice left for the code applied by the algorithms is a repetition code.

The dependency between the messages is illustrated in Table 2 and the decision-making process is illustrated in Table 3.

Table 3 is a non-recursive representation of the decision-making process. In each module this is based on all messages received by that module during the entire broadcast process. It starts with the deciding of dec1((0,a,b),d). In the second step of the decision-making process the decisions dec2((0,1),d) are calculated. In the third step the majorities dec3((0),d) are calculated and similarly for other modules. The arrows indicate respective decoder functions.

The Minimal Voting Method

For each class A(T, K, a, Ns) of JDC which are based on voting and coding, a subclass exists which is entirely based on voting. In this subclass thus only repetition codes are applied and consequently during each round of the broadcast process a received message m(s) is broadcast unchanged to a number of modules given by the set B(s). In order to reduce the amount of transmitted information as much as possible, during each round except the last one, each message is relayed to exactly 2T+1 modules, which is the minimum number that is required. During the last round message m(s,p) is sent to the modules in Ns-set(s,p). Such methods are called Minimal Voting methods. So the subclass of Minimal Voting within a class A(T, K, a, Ns) with N≧3T+1 and K=T+1 is made up of those which satisfy |B(s)|=2T+1 for s ∈ Sm and 1≦|s|≦K-1

The second example, for T=2, K=3 and N=7 gives the minimal voting method. In similar way as the earlier example, this is shown in Tables 4, 5, 6.

Example of a DJC Method from the Subclass Minimal Voting

During each round the messages are broadcast to the minimum number of destinations. No destination is passed for a second time. During the decision-making process only majority votes are applied.

TABLE 4

The next-sets
N = 7 T = 2 K = 3
Ns = {0,1,2,3,4,5,6}

| | | |
|---|---|---|
| | | B(0,1,2) = {3,4,5,6} |
| | | B(0,1,3) = {2,4,5,6} |
| | B(0,1) = {2,3,4,5,6} | B(0,1,4) = {2,3,5,6} |
| | | B(0,1,5) = {2,3,4,6} |
| | | B(0,1,6) = {2,3,4,5} |
| | B(0,2) = {1,3,4,5,6} | ... |
| B(0) = {1,2,3,4,5} | B(0,3) = {1,2,4,5,6} | ... |
| | B(0,4) = {1,2,3,5,6} | ... |
| | | B(0,5,1) = {2,3,4,6} |
| | | B(0,5,2) = {1,3,4,6} |
| | B(0,5) = {1,2,3,4,6} | B(0,5,3) = {1,2,4,6} |
| | | B(0,5,4) = {1,2,3,6} |
| | | B(0,5,6) = {1,2,3,4} |

TABLE 5

The messages
N = 7 T = 2 K = 3

| | | | |
|---|---|---|---|
| | | | m(0,1,2,3) |
| | | m(0,1,2)→ | m(0,1,2,4) |
| | | | m(0,1,2,5) |
| | | | m(0,1,2,6) |
| | | | m(0,1,3,2) |
| | | m(0,1,3)→ | m(0,1,3,4) |
| | | | m(0,1,3,5) |
| | | | m(0,1,3,6) |
| | m(0,1)→ | | |
| | | m(0,1,4)→ | ... |
| | | m(0,1,5)→ | ... |
| | | | m(0,1,6,2) |
| | | m(0,1,6)→ | m(0,1,6,3) |
| | | | m(0,1,6,4) |
| | | | m(0,1,6,5) |
| m(0)→ | m(0,2)→ m(0,3)→ m(0,4)→ | ... ... ... | |
| | | | m(0,5,1,2) |
| | | | m(0,5,1,3) |
| | | m(0,5,1)→ | m(0,5,1,4) |
| | | | m(0,5,1,6) |
| | | | m(0,5,2,1) |
| | | m(0,5,2)→ | m(0,5,2,3) |
| | | | m(0,5,2,4) |
| | | | m(0,5,2,6) |
| | m(0,5)→ | m(0,5,3)→ | ... |
| | | m(0,5,4)→ | ... |
| | | | m(0,5,6,1) |
| | | | m(0,5,6,2) |

TABLE 5-continued

The messages
N = 7 T = 2 K = 3

| | |
|---|---|
| m(0,5,6)→ | m(0,5,6,3) |
| | m(0,5,6,4) |

TABLE 6

The decision-making process
N = 7 T = 2 K = 3 m(0) → dec$_3$((0),0)
m(0,1) → dec$_2$((0,1),1)
m(0,2,1) → dec$_1$((0,2,1),1)
m(0,2,3,1) → dec$_1$((0,2,3),1)
m(0,2,4,1) → dec$_1$((0,2,4),1)  → dec$_2$((0,2),1)
m(0,2,5,1) → dec$_1$((0,2,6),1)
m(0,3,1) → dec$_1$((0,3,1),1)
m(0,3,2,1) → dec$_1$((0,3,2),1)
m(0,3,4,1) → dec$_1$((0,3,4),1)  → dec$_2$((0,3),1)  → dec$_3$((0),1)
m(0,3,5,1) → dec$_1$((0,3,5),1)
m(0,3,6,1) → dec$_1$((0,3,6),1)
... → dec$_2$((0,4),1)
m(0,5,1) → dec$_1$((0,5,1),1)
m(0,5,2,1) → dec$_1$((0,5,2),1)
m(0,5,3,1) → dec$_1$((0,5,3),1)  → dec$_2$((0,5),1)
m(0,5,4,1) → dec$_1$((0,5,4),1)
m(0,5,6,1) → dec$_1$((0,5,6),1)
...  → dec$_3$((0),2)
...  → dec$_3$((0),3)
...  → dec$_3$((0),4)
...  → dec$_3$((0),5)
...  → dec$_3$((0),6)

The Maximal Coding

For each class A(T, K, a, Ns) of Interactive Consistency methods which is based on voting and coding, another subclass exists in which the advantages of using error-correcting codes are used to the full in order to reduce the amount of information which needs to be transmitted. These are called Maximal Coding methods.

When a T-error-correcting code $Y_{(s)}$ is applied consisting of code words of $n_{(s)}$ symbols of size $b_{(s)}$ and data words consisting of $k_{(s)}$ symbols of the same size, then the total amount of information broadcast by a module during round t is a factor $n_{(s)}/k_{(s)}$ more than the amount of information received by that module during round t-1.

We know that a T-error-correcting code $Y_{(s)}$ can be constructed if and only if $n_{(s)} \geq k_{(s)} + 2T$.

In the subclass of Maximal Coding methods, the fraction $n_{(s)}/k_{(s)}$ is kept as low as possible. So the partially encoded messages are sent to as many modules as is allowed by the DJC procedure and we choose $n_{(s)} = k_{(s)} + 2T$. Codes with these parameters always exist if the symbol size $b_{(s)}$ satisfies $b_{(s)} \geq \log_2(n_{(s)} - 1)$ Now, $2T + 1 \leq |B(s)| \leq |Ns\text{-set}(s)51$ for $1 \leq |s| \leq K-1$ and $s \in Sm$ We choose the set B(s) to be as large as possible, thus $|B(s)| = |Ns\text{-set}(s)|$ for $1 \leq |s| \leq K-1$ and $s \in Sm$.

Let t denote the round in which the code $Y_{(s)}$ is applied. So $|s| = t+1$. Then follows
$n_{(s)} = |B(s)| = N-t-1$ for $0 \leq t \leq K-2$ So the subclass of Maximal Coding within class A(T, K, a, Ns) is characterized by the parameters of the applied T-error-correcting codes as follows: for each round t with $0 < t < K-2$ a T-error-correcting code is applied with parameters
number of code words symbols: $n_{(s,a)} = N-t-1$
number of data word symbols: $k_{(s,a)} = N-t-1-2T$
symbol size in number of bits:

if $N-t-1 \geq 2T+1$ then: $b_{(s,a)} \geq \log_2(N-t-2)$
if $N-t-1 = 2T+1$ then: $b_{(s,a)} \geq 1$ Notice that in the case of a repetition. code, i.e. $N-t-1 = 2T+1$, the minimal symbol size is only 1.

Because during each round of information exchange, except the last, a partial encoder function is applied to the message, the message size decreases each round. We will elaborate on this in the next chapter.

If $N = 3T+1$ the code used during round K-2 is always a simple repetition code. This follows immediately and $K = T+1$. During the last round, i.e. round K-1, the messages are forwarded unchanged to their destinations.

The Subset Method

It has been shown that once agreement among N' modules, with $N' \geq 2T+1$ in a set of N modules of which at most T are faulty, is obtained, the agreement property can be obtained in all N modules by partially encoding the data in each of the N' modules and sending this encoded data to the remaining N—N' modules. In contrast to the DJC, each of the N' modules calculates only one symbol of the error-correcting code and sends this symbol to all modules in the set of N—N' modules.

Clearly in order to obtain agreement in the N' modules at least $3T+1$ modules need to be involved, but not all the modules involved need to execute the decision-making process. Consequently the data received by the modules involved during round K-2, has only to be sent to the destinations represented by the set N'. This reduces the information to be transmitted during round K-1. So this is an adapted case based on voting and coding, which is built from DJC and in which the set of destinations N' is only a subset of the total set of modules Ns. The only difference now is in round K-1 and round K, i.e. during round K-1 messages are only sent to the modules in N' and during round K the decision-making process is only executed in the destinations in N'. The interactive consistency properties remain valid for the decisions calculated in the modules represented by N'.

The amount of information which needs to be transmitted only depends on the error-correcting codes chosen. So reducing the set of destinations influences only the last round of information exchange, i.e. round K-1.

So let a system consist of N modules identified by the Ns of which at most T are faulty. This system first executes any adapted interactive consistency method, which is chosen from the class of DJC
A(T, K, 0, N') with:
$K = T+1$ and $|N'| \geq 3T+1$ This will lead to agreement among the correctly functioning modules of the set N' about the original message in the source. In the N' modules a partial encoder function of a T-error-correcting code Z consisting of code words of $n_z$ symbols and $n_z = |N'|$, is applied on the calculated decision. Thus, Z(i) is applied on the decision in module i, with i ∈ Ns. Notice that in this case the T-error-correcting code Z is determined by N' sources and that in each of the sources one partial encoder function is applied. However in the Interactive Consistency based on voting and coding the T-error-correcting coder is determined by the number of modules to which a modified message is to be sent, i.e. the next-set B(s), and in one module $n_c$ partial encoder functions are applied; one for each direction in which a message is to be sent.

In the Subset Method in the additional round of information exchange, round K, the partial encoded decisions are sent to all N—N' remaining modules which each apply the decoder function $Z^{(-1)}$ on the received data. Because correct functioning modules in the set of N' modules have reached agreement and there are no more than T faulty modules, the correct modules among the N—N' modules arrive at the same decision as the N' modules did.

The Subset Method is often very efficient, though it has to be paid for by an additional round. We will call the subset of N' modules the "active modules" and the remaining modules the "passive modules". In our Subset Method some of the passive modules may be involved in the broadcasting process of the interactive consistency method.

An example of this is the following: N=50, K=3, T=2. For this we need $3T+1=7=N'$ modules. After deciding, $2T+1=5$ modules need to send their decision result to the $50-7=43$ other modules for a secondary decision in those latter modules.

I claim:

1. A multimodule data processing system having N fully interconnected data processing modules for executing a Dispersed Joined Communication method according to a K-level nested and level-wise compartimentalized encoding, broadcasting and decoding operation, for protecting against at most T maliciously operating modules, wherein $K=T+1$, wherein at level K all said N modules are situated in a single compartment, and wherein at level $k=1$ said operation for any extant message in any actual module comprises broadcasting such extant message to all modules present in that message's compartment, and wherein for any level $K+1>k>1$ said operation previously comprises for any extant message generating therefrom $n>2T$ symbols according to a T-symbol error correcting encoding and within that message's actual compartment transmitting each of such n symbols as messages each to a respective different module, those different modules together constituting a next lower-level compartment for therein executing said operation according to next lower level k-1, and wherein at least one level $k>1$ comprises a data reducing encoding, and wherein after such K rounds of information transmission said method comprises exclusively single-module-based and in each such single module compartment-wise decoding according to successive levels (1 . . . K) of any message or symbol.

2. A multimodule data processing system having N fully interconnected data processing modules for executing a Dispersed Joined Communication method according to a K-level nested and level-wise compartimentalized encoding, broadcasting and decoding operation, for protecting against at most T maliciously operating modules, wherein $K=T+1$, wherein at level K all said N modules are situated in a single compartment, and wherein at level $k=1$ said operation for any extant message in any actual module comprises broadcasting such extant message to all modules present in that message's compartment, and wherein for any level $K+1>k>1$ said operation previously comprises for any extant message generating therefrom $n>2T$ symbols according to a T-symbol error correcting encoding and within that message's actual compartment transmitting each of such n symbols as messages each to a respective different module, those different modules together constituting a next lower-level compartment for therein executing said operation according to next lower level $k-1$, and wherein at least one level $k>1$ comprises transmitting to less than all other modules in said actual compartment, and wherein after such K rounds of information transmission said method comprises exclusively single-module-based and in such single module compartment-wise decoding according to successive levels (1 . . . K) of any message or symbol.

3. A method as claimed in claim 1, wherein N=7, T=2 and K=3.

4. A method as claimed in claim 2, wherein $K>2$ and at least one level $k>1$ comprises a data reducing encoding.

5. A system as claimed in claim 1, wherein in said data reducing encoding the number of said different modules on at least one level is equal to the number of symbols available for transmission thereto within at least one actual said compartment.

6. A system as claimed in claim 1, wherein for $T>1$ on at least one later level encoded symbols are shorter than those produced on at least one earlier level.

7. A system as claimed in any of claims 1, wherein on any single level all symbols generated have uniform lengths.

8. A system as claimed in any of claims 1, wherein after said encoding, broadcasting and decoding operation of a subset of said N modules consisting of $N'>3T$ modules of which at most T are faulty, agreement has been attained, in each of at least $2T+1$ modules of said N' modules the locally decoded data is partially encoded and thereupon sent to all remaining N—N' modules.

* * * * *